US012642111B2

(12) United States Patent
Lin et al.

(10) Patent No.: US 12,642,111 B2
(45) Date of Patent: May 26, 2026

(54) PACKAGE STRUCTURE

(71) Applicant: Taiwan Semiconductor Manufacturing Company, Ltd., Hsinchu (TW)

(72) Inventors: Chien-Chang Lin, New Taipei (TW); Yen-Fu Su, Hsinchu (TW); Chin-Liang Chen, Kaohsiung (TW); Wei-Yu Chen, Hsinchu (TW); Hsin-Yu Pan, Taipei (TW); Yu-Min Liang, Taoyuan (TW); Hao-Cheng Hou, Hsinchu (TW); Chi-Yang Yu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 785 days.

(21) Appl. No.: 17/897,206

(22) Filed: Aug. 28, 2022

(65) Prior Publication Data

US 2024/0071888 A1     Feb. 29, 2024

(51) Int. Cl.
H01L 23/498 (2006.01)
H01L 25/065 (2023.01)
H01L 23/00 (2006.01)

(52) U.S. Cl.
CPC .. H01L 23/49838 (2013.01); H01L 23/49816 (2013.01); H01L 23/49822 (2013.01);
(Continued)

(58) Field of Classification Search
CPC .............................................. H01L 23/49838
See application file for complete search history.

(56) References Cited

U.S. PATENT DOCUMENTS 5,796,589 A * 8/1998 Barrow ................ H05K 3/0094
361/779
6,049,122 A * 4/2000 Yoneda ................... H01L 24/29
257/737

(Continued)

OTHER PUBLICATIONS

"Office Action of Taiwan Counterpart Application", issued on Dec. 21, 2023, p. 1-p. 8.

*Primary Examiner* — William A Harriston
(74) *Attorney, Agent, or Firm* — JCIPRNET

(57) ABSTRACT

A package structure including a redistribution circuit structure, a wiring substrate, first conductive terminals, an insulating encapsulation, and a semiconductor device is provided. The redistribution circuit structure includes stacked dielectric layers, redistribution wirings and first conductive pads. The first conductive pads are disposed on a surface of an outermost dielectric layer among the stacked dielectric layers, the first conductive pads are electrically connected to outermost redistribution pads among the redistribution wirings by via openings of the outermost dielectric layer, and a first lateral dimension of the via openings is greater than a half of a second lateral dimension of the outermost redistribution pads. The wiring substrate includes second conductive pads. The first conductive terminals are disposed between the first conductive pads and the second conductive pads. The insulating encapsulation is disposed on the surface of the redistribution circuit structure. The insulating encapsulation laterally encapsulates the wiring substrate.

20 Claims, 11 Drawing Sheets

(52) U.S. Cl.

CPC .... *H01L 23/49833* (2013.01); *H01L 25/0652*
(2013.01); *H01L 23/49894* (2013.01); *H01L
24/08* (2013.01); *H01L 24/16* (2013.01); *H01L
24/32* (2013.01); *H01L 24/73* (2013.01); *H01L
2224/08145* (2013.01); *H01L 2224/16225*
(2013.01); *H01L 2224/32225* (2013.01); *H01L
2224/73204* (2013.01); *H01L 2924/1431*
(2013.01); *H01L 2924/1434* (2013.01); *H01L
2924/3511* (2013.01); *H01L 2924/35121*
(2013.01); *H01L 2924/37001* (2013.01)

(56) References Cited

U.S. PATENT DOCUMENTS

| | | | |
|---|---|---|---|
| 6,552,436 B2 * | 4/2003 | Burnette | H01L 23/585 |
| | | | 438/666 |
| 6,780,673 B2 * | 8/2004 | Venkateswaran | H01L 21/563 |
| | | | 29/874 |
| 8,350,384 B2 * | 1/2013 | Pendse | H01L 21/563 |
| | | | 257/781 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 * | 3/2016 | Chiu | H01L 21/6835 |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,269,773 B1 * | 4/2019 | Yu | H01L 24/19 |
| 10,319,683 B2 * | 6/2019 | Yu | H01L 23/5389 |
| 11,355,454 B2 * | 6/2022 | Tsai | H01L 23/5383 |
| 12,278,205 B2 * | 4/2025 | Williamson | H01L 23/49894 |
| 2004/0113285 A1 * | 6/2004 | Tay | H01L 23/49816 |
| | | | 257/737 |
| 2005/0017058 A1 * | 1/2005 | Ho | B23K 1/0018 |
| | | | 228/215 |
| 2005/0275096 A1 * | 12/2005 | Zeng | B23K 35/262 |
| | | | 257/772 |
| 2008/0179740 A1 * | 7/2008 | Liao | H05K 3/243 |
| | | | 257/738 |
| 2013/0234318 A1 * | 9/2013 | Lee | H01L 23/49811 |
| | | | 257/737 |
| 2014/0168909 A1 * | 6/2014 | Zheng | H05K 3/3452 |
| | | | 361/728 |
| 2015/0223338 A1 * | 8/2015 | Noda | H05K 3/4015 |
| | | | 361/767 |
| 2018/0061801 A1 | 3/2018 | Seol et al. | |
| 2019/0051621 A1 * | 2/2019 | Liu | H01L 23/585 |
| 2019/0148273 A1 * | 5/2019 | Hu | H01L 23/49822 |
| | | | 257/774 |
| 2020/0176405 A1 * | 6/2020 | Wu | H01L 25/0657 |
| 2020/0194393 A1 * | 6/2020 | Wu | H01L 23/5389 |
| 2020/0251436 A1 * | 8/2020 | Williamson | H01L 23/49894 |
| 2020/0395308 A1 * | 12/2020 | Wu | H01L 21/6835 |
| 2020/0411442 A1 * | 12/2020 | Hu | H01L 23/49822 |
| 2021/0202266 A1 * | 7/2021 | Chen | H01L 23/145 |
| 2021/0202396 A1 * | 7/2021 | Wu | H01L 23/5389 |
| 2021/0225791 A1 * | 7/2021 | Tsai | H01L 24/20 |
| 2021/0366863 A1 * | 11/2021 | Wu | H01L 24/19 |
| 2021/0375785 A1 * | 12/2021 | Wu | H01L 21/4857 |
| 2022/0028773 A1 * | 1/2022 | Lu | H01L 25/18 |
| 2022/0037266 A1 * | 2/2022 | Tsai | H01L 23/5383 |
| 2022/0352129 A1 * | 11/2022 | Lim | H01L 24/19 |
| 2023/0307337 A1 * | 9/2023 | Chen | H01L 21/4857 |
| 2023/0361052 A1 * | 11/2023 | Tsai | H01L 23/5383 |
| 2024/0063130 A1 * | 2/2024 | Chen | H01L 23/5389 |

* cited by examiner

PACKAGE STRUCTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed, greater bandwidth, as well as lower power consumption and latency has grown recently, there has grown a need for improvements of semiconductor packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2:
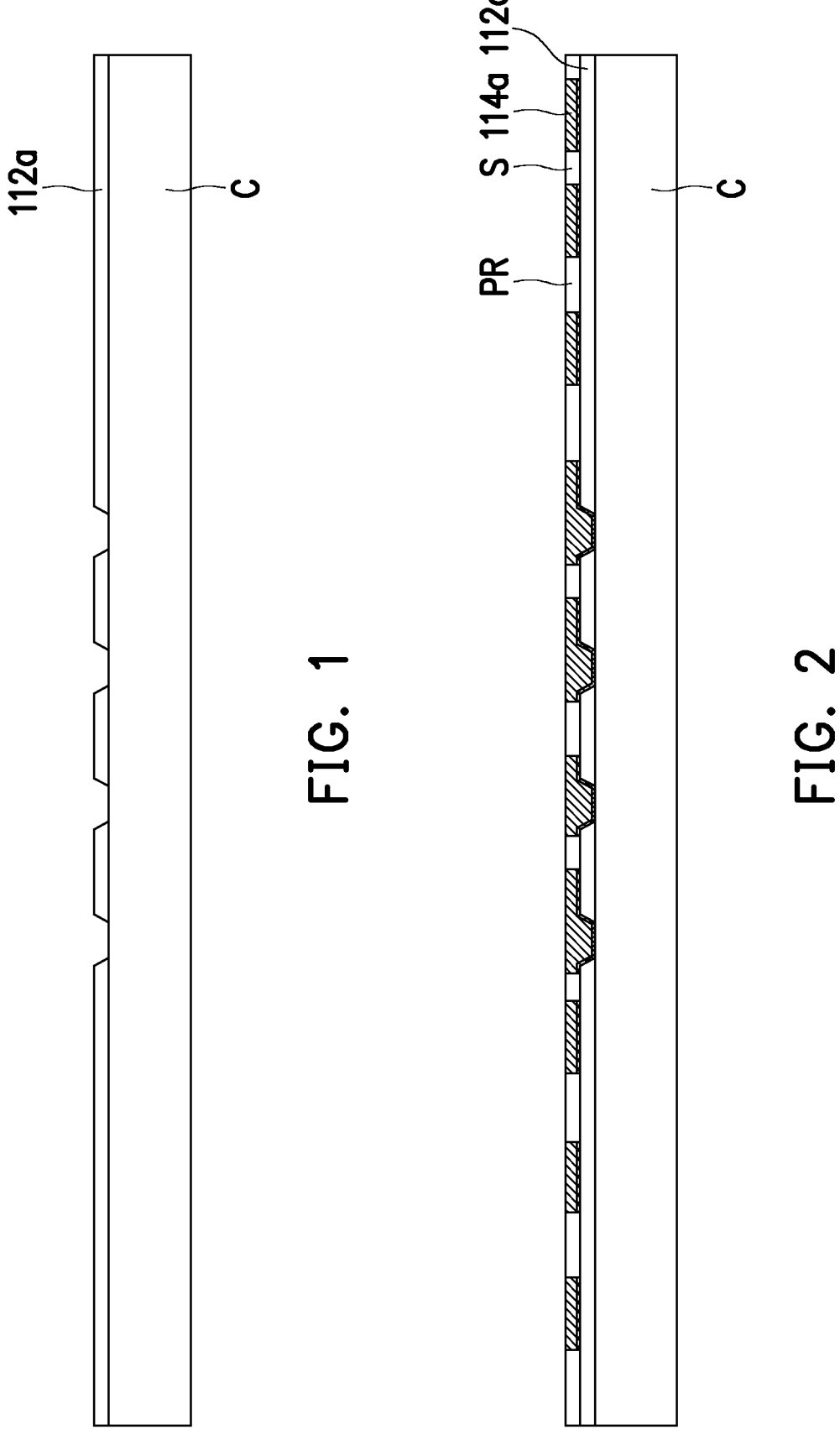
FIG. 1 through FIG. 9 are cross-sectional views schematically illustrating a process flow for fabricating a package structure in accordance with the first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3 DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Various embodiments for improving reliability of semiconductor package are described as followings. In some embodiments, the crack issue of an outermost dielectric layer of a redistribution circuit structure in a System on Integrated Substrate (SoIS) structure can be solved. In some other embodiments, the crack issue of a solder resist layer of wiring substrate in an SoIS structure can be solved.

FIG. 1 through FIG. 9 are cross-sectional views schematically illustrating a process flow for fabricating a package structure in accordance with the first embodiment of the present disclosure.

Figure 3:
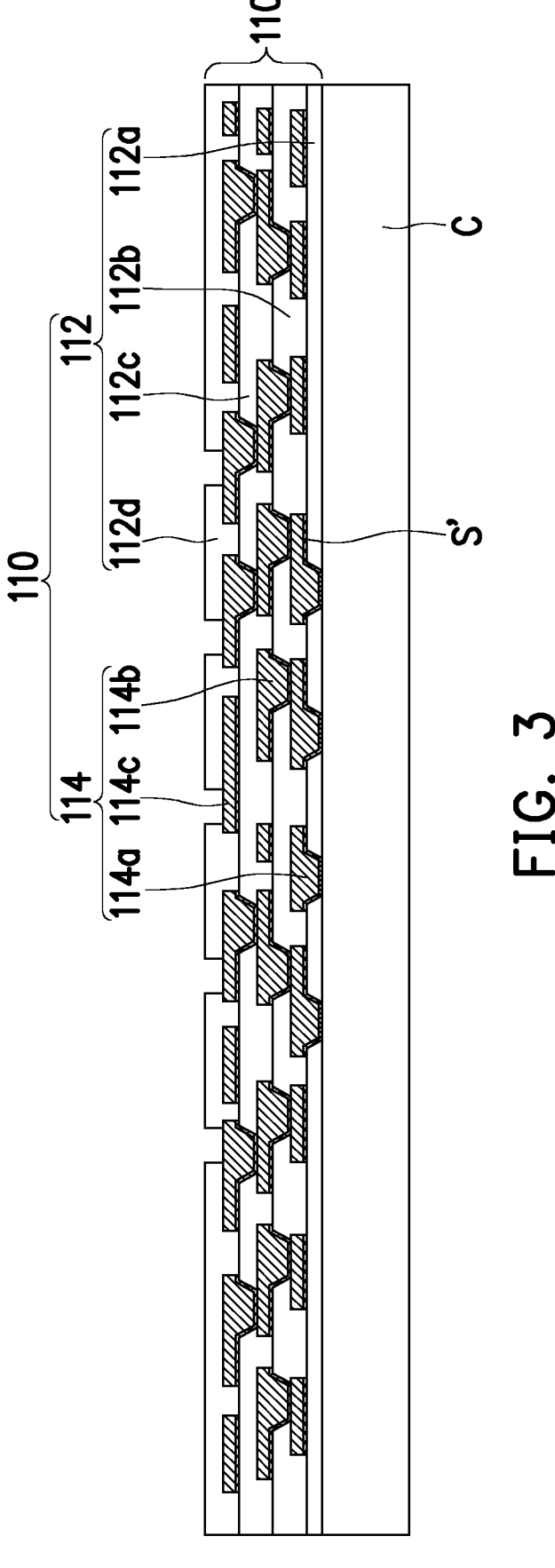

Referring to FIG. 1 through FIG. 3, a carrier C is provided and a redistribution circuit structure 110 is formed over the carrier C. In some embodiments, the redistribution circuit structure 110 is a wafer form redistribution circuit structure 110 formed over a wafer form carrier C. The carrier C may be a semiconductor wafer (e.g., a silicon wafer). The redistribution circuit structure 110 may include stacked dielectric layers 112 and redistribution wirings 114 between the stacked dielectric layers 112. The stacked dielectric layers 112 are formed and stacked over the carrier C. The redistribution wirings 114 are embedded in the stacked dielectric layers 112 carried by the carrier C.

As illustrated in FIG. 1, a first dielectric layer 112a is formed over the carrier C. The first dielectric layer 112a may include openings and portions of the carrier C are revealed by the openings defined in the first dielectric layer 112a. In some embodiments, the material of the first dielectric layer 112a includes polybenzoxazole (PBO), polyimide (PI) or other suitable polymer dielectric material. In some alternative embodiments, the material of the dielectric layer 112a includes resin mixed with filler. The first dielectric layer 112a may be formed by photo-patternable material and patterned by a photolithography process.

As illustrated in FIG. 2, a seed layer S is formed over the first dielectric layer 112a such that the first dielectric layer 112a and the portions of the carriers C which are revealed by the openings defined in the first dielectric layer 112a are covered by the seed layer S. The seed layer S may be a Ti/Cu seed layer which entirely covers the first dielectric layer 112a. The seed layer S may be formed by sputtering. After forming the seed layer S, a patterned photoresist layer PR is formed on the seed layer S. The patterned photoresist layer PR includes trenches, and portions of the seed layer S are revealed by the trenches defined in the patterned photoresist layer PR. After the patterned photoresist layer PR is formed on the seed layer S, a plating process may be performed by using the patterned photoresist layer PR as a mask such that first conductive wirings 114a are plated in the trench and the revealed portions of the seed layer S are covered by the first conductive wirings 114a.

After forming the first conductive wirings 114a, the patterned photoresist layer PR is removed such that portions of the seed layer S that are not covered by the first conductive wirings 114a are revealed, and a patterned seed layer S' is formed under the first conductive wirings 114a. An etching process may be performed to remove the portions of the seed layer S that are not covered by the first conductive wirings 114a until portions of the first dielectric layer 112a are revealed. As illustrated in FIG. 2, the first conductive wirings 114a and the patterned seed layer S' may be collectively referred as a layer of redistribution wirings.

As illustrated in FIG. 3, after the first dielectric layer 112a and the first conductive wirings 114a are formed, a second dielectric layer 112b, second conductive wirings 114b, a third dielectric layer 112c, third conductive wirings 114c and a fourth dielectric layer 112d may be formed over the carrier C such that the redistribution circuit structure 110 is formed. The fabrication process of the second dielectric layer 112b, the third dielectric layer 112c and the fourth dielectric layer 112d may be similar to that of the first dielectric layer 112a. The fabrication process of the second conductive wirings 114b and the third conductive wirings 114c may be similar to that of the first conductive wirings 114a. The number of the stacked dielectric layers 112 and the redistribution wirings 114 in the redistribution circuit structure 110 may be modified in accordance with design rule of products.

The redistribution wirings 114 may include conductive wirings and conductive vias electrically connected between conductive wirings, wherein the conductive wirings may transmit signal horizontally, and the conductive vias may transmit signal vertically. The material of the redistribution wirings 114 may include copper or other suitable metallic materials.

Figure 4:
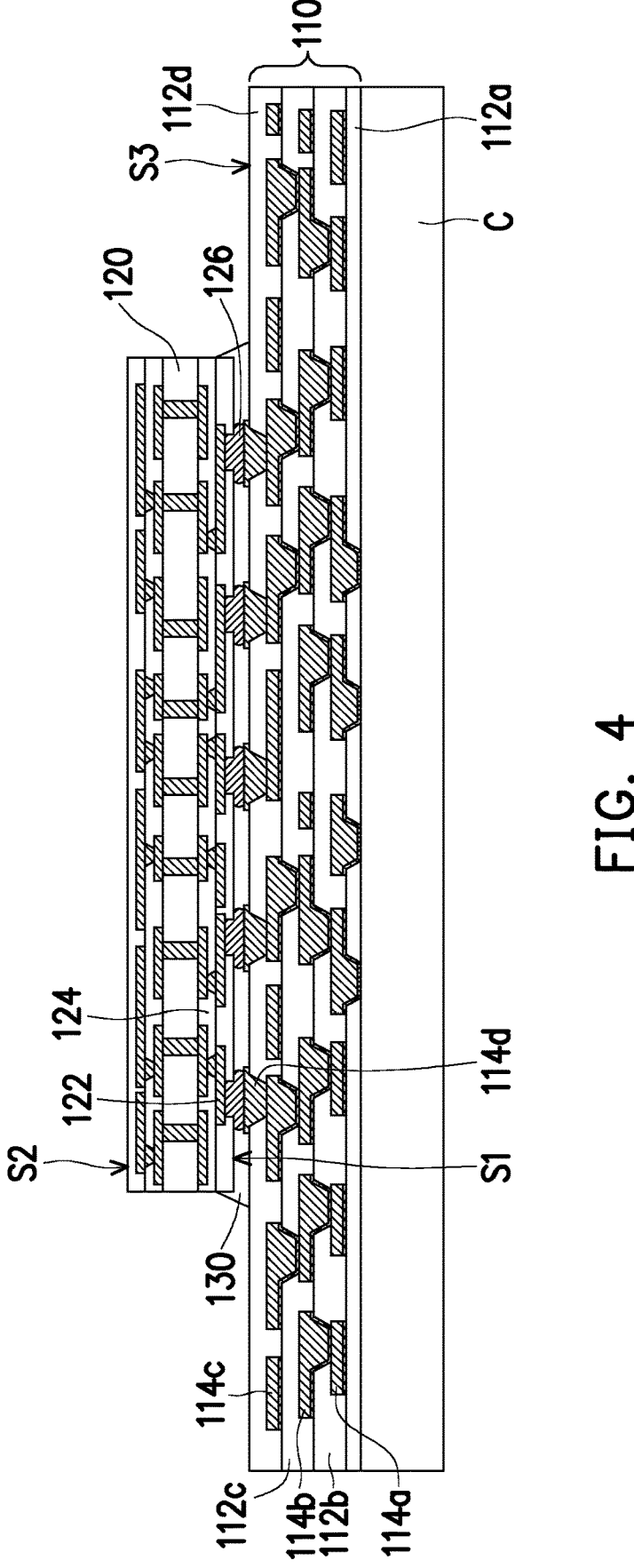

Referring to FIG. 4, after forming the stacked dielectric layers 112 including the first dielectric layer 112a, the second dielectric layer 112b, the third dielectric layer 112c, and the fourth dielectric layer 112d as well as the redistribution wirings 114 including the first conductive wirings 114a, the second conductive wirings 114b and the third conductive wirings 114c, conductive pads 114d are formed over a surface S3 of the redistribution circuit structure 110 and electrically connected to the third conductive wirings 114c. In some embodiments, the conductive pads 114d include under bump metallurgy (UBM) patterns formed on the fourth dielectric layer 112d, and the UBM patterns are landed on and electrically connected to the third conductive wirings 114c.

As illustrated in FIG. 4, at least one wiring substrate 120 is provided over the redistribution circuit structure 110 carried by the carried C. In some alternative embodiments, multiple wiring substrates 120 are provided and mounted over the surface S3 of the redistribution circuit structure 110 carried by the carried C. The number of the wiring substrate 120 is not limited in the present invention. In some embodiments, the wiring substrate 120 includes a first surface S1 (e.g., a bottom surface) and a second surface S2 (e.g., a top surface) opposite to the first surface S1. The wiring substrate 120 may include conductive pads 122, a solder resist layer 124 and conductive terminals 126, wherein the conductive terminals 126 are electrically connected to the conductive pads 122 through openings defined in the solder resist layer 124. The conductive terminals 126 protrude from the first surface S1 of the wiring substrate 120. The conductive terminals 126 are arranged in array and distributed on the first surface S1 of the wiring substrate 120. The conductive terminals 126 may include solder posts or solder bumps arranged in array. The conductive terminals 126 may be collectively referred as ball-grid-array (BGA) terminals. The wiring substrate 120 may be placed onto the surface S3 of the redistribution circuit structure 110 such that the first surface S1 of the wiring substrate 120 faces the redistribution circuit structure 110. A reflow process is then performed such that the wiring substrate 120 can be mounted and electrically connected to the redistribution wirings 114 of the redistribution circuit structure 110 through the conductive terminals 126. After the wiring substrate 120 is mounted on the redistribution circuit structure 110 carried by the carrier C, a space is defined between the wiring substrate 120 and the surface S3 of the redistribution circuit structure 110. In other words, the first surfaces S1 of the wiring substrate 120 is separated from the surface S3 of the redistribution circuit structure 110 by a predetermined distance. For example, the predetermined distance between the first surfaces S1 of the wiring substrate 120 and the surface S3 of the redistribution circuit structure 110 ranges from about 50 micrometers to about 100 micrometers.

As illustrated in FIG. 4, an underfill 130 is formed over the redistribution circuit structure 110 to fill the space between the redistribution circuit structure 110 and the wiring substrate 120 and laterally encapsulate the conductive terminals 126 such that reliability of the conductive terminals 126 may be enhanced. The underfill 130 may partially cover sidewalls of the wiring substrate 120. The material of the underfill 130 may be an insulating material and include a resin (e.g., epoxy resin), a filler material, a stress release agent (SRA), an adhesion promoter, other material, or a combination thereof. In some alternative embodiments, formation of the underfill 130 may be omitted.

Figure 5:
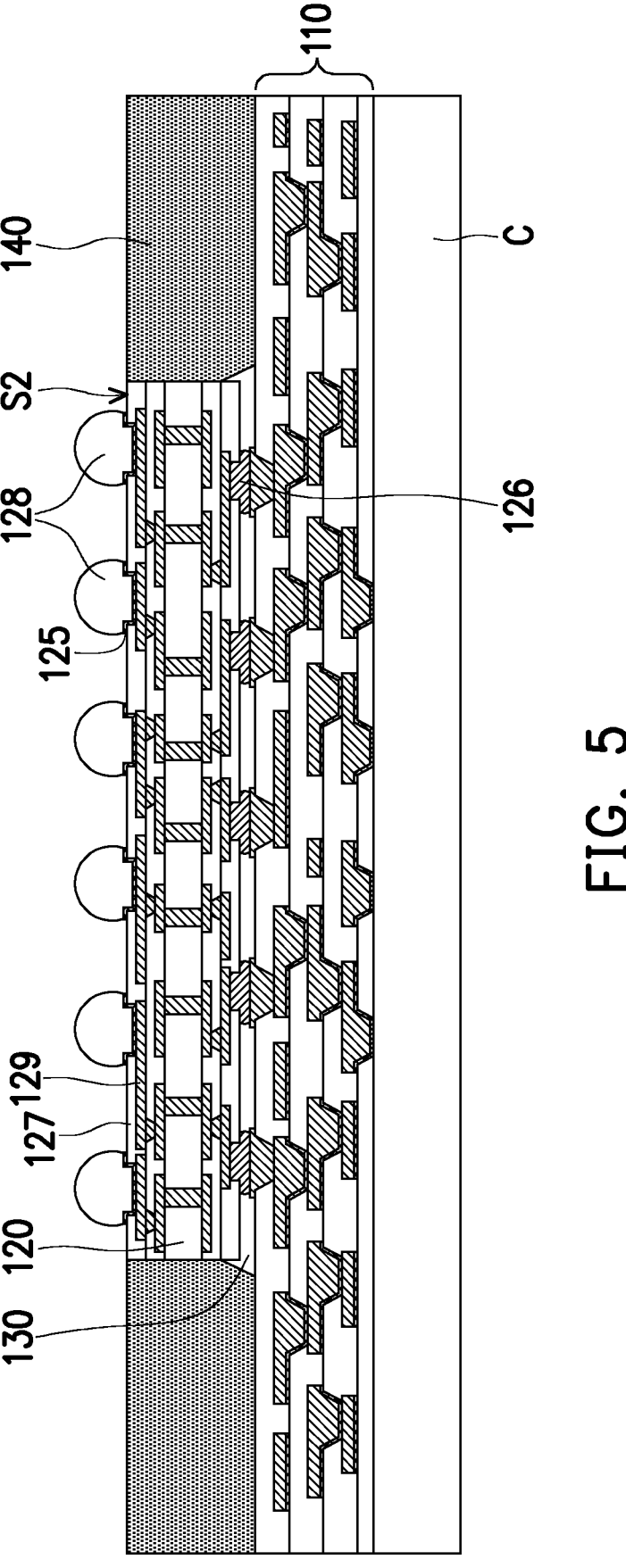

Referring to FIG. 5, an insulating encapsulation 140 is formed on the redistribution circuit structure 110 to laterally encapsulate the wiring substrate 120 and the underfill 130. In some embodiments, an over-mold process is performed to form an encapsulation material over the redistribution circuit structure 110 such that the wiring substrate 120 and the underfill 130 are covered by the encapsulation material. The material of the insulating encapsulation 140 may include molding compound or molded underfill (MUF). In some embodiments, the material of the insulating encapsulation 140 may include epoxy resins, phenolic hardeners, silicas, catalysts, pigments, mold release agents and so on. After forming the encapsulation material, a removal process is performed to partially remove a portion of the encapsulation material until the second surface S2 of the wiring substrate 120 is revealed. After performing the removal process of the encapsulation material, the insulating encapsulation 140 is formed, wherein the second surface S2 of the wiring substrate 120 may be substantially leveled with, slightly lower than or slightly higher than a surface 142 of the insulating encapsulation 140. The above-mentioned removal process of the encapsulation material may be chemical mechanical polishing (CMP) process, mechanical grinding process or other suitable removal process.

After forming the insulating encapsulation 140, an uppermost dielectric layer 127 of the wiring substrate 120 is patterned such that conductive wirings in the wiring substrate 120 are revealed. Then, conductive terminals 128 are formed on the second surface S2 of the wiring substrate 120, wherein the conductive terminals 128 are electrically connected to the revealed conductive wirings 129 in the wiring substrate 120. The dimension of the conductive terminals 128 may be greater than that of the conductive terminals 126. The conductive terminals 128 may be collectively referred as ball-grid-array (BGA) terminals. In some embodiments, under-ball metallurgy (UBM) layers 125 are formed on the second surface S2 of the wiring substrate 120 such that the UBM layers 125 are located between the conductive terminals 128 and the conductive wirings 129. The conductive terminals 128 may be solder balls landing on the UBM layers 125. The conductive terminals 128 may be spaced apart from the uppermost dielectric layer 127 of the wiring substrate 120 by the UBM layers 125.

After forming the conductive terminals 128, a SoIS structure including the redistribution circuit structure 110, the wiring substrate 120, the underfill 130 and the insulating encapsulation 140 are fabricated.

Figure 6:
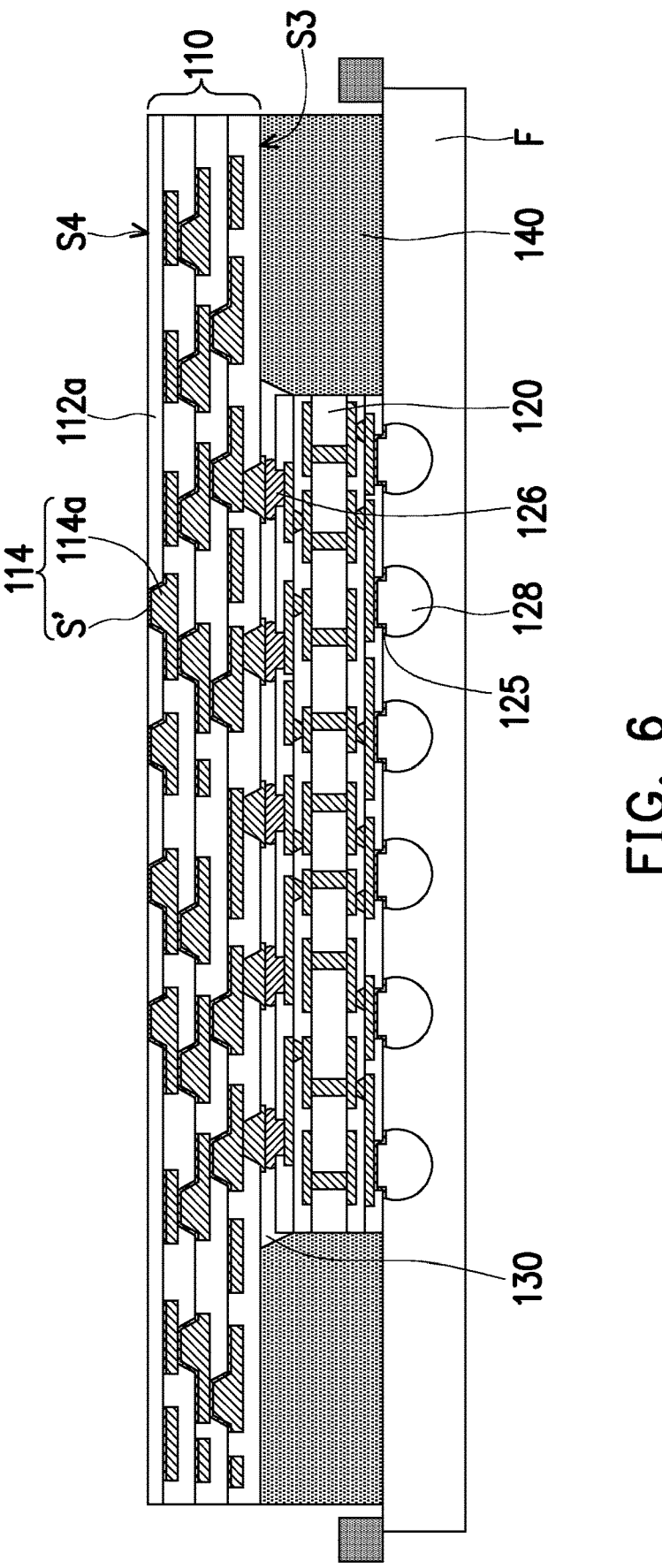

Referring to FIG. 5 and FIG. 6, after forming the conductive terminals 128, a de-bonding process is performed such that a resulted structure (the above-mentioned SoIS structure shown in FIG. 5) including the redistribution circuit structure 110, the wiring substrate 120, the conductive terminals 126, the conductive terminals 128, the underfill 130 and the insulating encapsulation 140 are de-bonded from the carrier C. After performing the de-bonding process, a frame mount process is performed to mount the resulted structure on a frame F. As illustrated in FIG. 6, the resulted structure de-bonded from the carrier C is flipped upside down and mounted onto the frame F such that a surface S4 of the redistribution circuit structure 110 is revealed, wherein the surface S4 of the redistribution circuit structure 110 is opposite to the surface S3 of the redistribution circuit structure 110.

As illustrated in FIG. 6, after performing the de-bonding process, the uppermost redistribution wirings 114 including the first conductive wirings 114a and the patterned seed layer S' are partially revealed from the surface S4 of the redistribution circuit structure 110. In other words, portions of the patterned seed layer S' are revealed from the surface S4 of the redistribution circuit structure 110. Furthermore, the first dielectric layer 112a is revealed after performing the de-bonding process. In the present embodiments, the thickness of the outermost dielectric layer 112a of the redistribution circuit structure 110 is greater than 7 micrometers such that the first dielectric layer 112a can provide sufficient barrier and/or buffer function.

Figure 7:
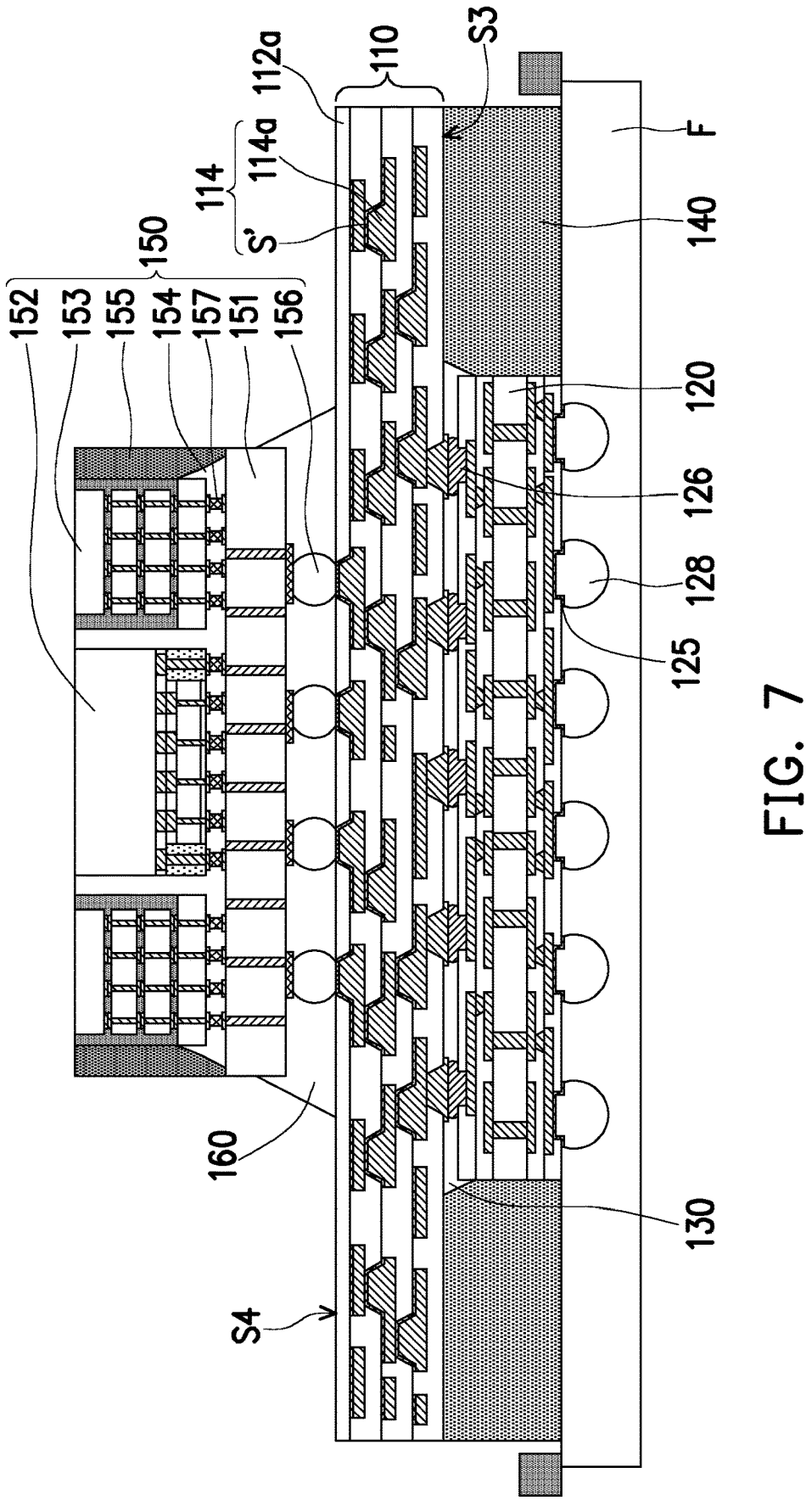

Referring to FIG. 7, at least one semiconductor device 150 is provided and mounted on the surface S4 of the redistribution circuit structure 110, wherein the at least one semiconductor device 150 is electrically connected to the wiring substrate 120 through the redistribution circuit structure 110. The at least one semiconductor device 150 is provided and mounted on the redistribution circuit structure 110 through, for example, a chip-to-wafer bonding process such that the at least one semiconductor device 150 is electrically connected to the outermost redistribution wirings 114a of the redistribution circuit structure 110. In some embodiments, the at least one semiconductor device 150 may be a chip package including an interposer 151, a semiconductor die 152, memory cubes 153, an underfill 154, an insulating encapsulation 155, and conductive terminals 156. The semiconductor die 152 and the memory cubes 153 may be disposed on the top surface of the interposer 151.

The semiconductor die 152 and the memory cubes 153 may be electrically connected to the interposer 151 through conductive bumps 157 (e.g., micro-bumps) laterally encapsulated by the underfill 154. The above-mentioned conductive bumps 157 are spaced apart from the insulating encapsulation 155 by the underfill 154. The underfill may 154 fill the space between the interposer 151 and the semiconductor die 152 as well as the space between the interposer 151 and the memory cubes 153. The insulating encapsulation 155 encapsulates the semiconductor die 152, the memory cubes 153 and the underfill 154. The conductive terminals 156 are disposed on the bottom surface of the interposer 151.

The conductive terminals 156 may include controlled collapse of chip connection bumps (C4 bumps). In some embodiments, the above-mentioned C4 bumps are lead-free solder C4 bumps. In some other embodiments, the above-mentioned C4 bumps includes copper pillar and lead-free solder cap covering the copper pillar. The conductive terminals 156 may land on and be in contact with the patterned seed layer S' of the uppermost redistribution wirings 114. In some embodiments, each of the conductive bumps 157 includes a chip-side conductive portion, an interposer-side conductive portion and a solder joint, the solder joint is between the chip-side conductive portion and the interposer-side conductive portion. The chip-side conductive portion may include a copper/nickel bump, the interposer-side conductive portion may include a copper/nickel bump, and the nickel layers among the copper/nickel bumps of the chip-side conductive portion and the interposer-side conductive portion are electrically connected to each other through the solder joint.

The interposer 151 may be a semiconductor interposer (e.g., a silicon interposer) including through semiconductor vias (e.g., through silicon vias). The semiconductor die 152 may be logic die, a system on chip (SOC) die or other suitable semiconductor die. In some embodiments, the semiconductor die 152 may be an system on integrated circuit (SoIC) structure including multiple hybrid bonded and stacked semiconductor chips, wherein the semiconductor chips may be different in width. The semiconductor die 152 may include a first chip, a second chip and an insulating encapsulation, wherein the first chip is encapsulated by the insulating encapsulation and hybrid bonded with the second chip. The memory cubes 153 may include high bandwidth memory (HBM) cubes or other suitable memory device. The material of the underfill 154 is an insulating material and may include a resin (e.g., epoxy resin), a filler material, a stress release agent (SRA), an adhesion promoter, other material, or a combination thereof. The material of the insulating encapsulation 155 may include molding compound or molded underfill (MUF). In some embodiments, the material of the insulating encapsulation 155 may include epoxy resins, phenolic hardeners, silicas, catalysts, pigments, mold release agents and so on. The conductive terminals 156 may include controlled collapse chip connection (C4) bumps.

As illustrated in FIG. 7, after the at least one semiconductor device 150 is mounted on the redistribution circuit structure 110 through the conductive terminals 156, an underfill 160 may be formed on the surface S4 of the redistribution circuit structure 110 to fill a space between the at least one semiconductor device 150 and the redistribution circuit structure 110. In addition, the underfill 160 may further cover sidewalls of the at least one semiconductor device 150. The material of the underfill 160 is an insulating material and may include a resin (e.g., epoxy resin), a filler material, a stress release agent (SRA), an adhesion promoter, other material, or a combination thereof.

Figure 8:
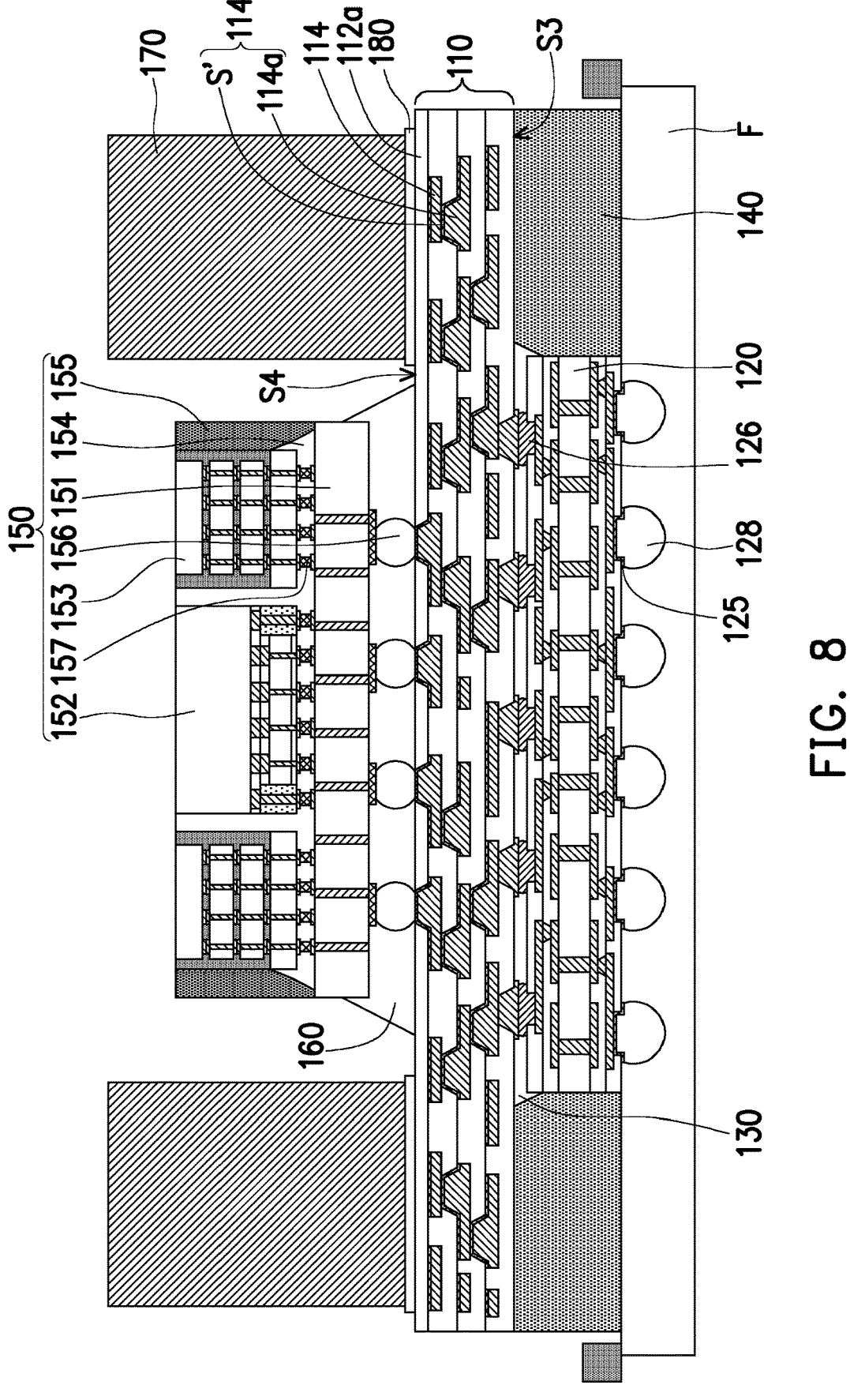

Referring to FIG. 7 and FIG. 8, after the at least one semiconductor device 150 is mounted on and bonded with the redistribution circuit structure 110, a stiffener ring 170 is provided and adhered with the surface S4 of the redistribution circuit structure 110 by an adhesive 180. The stiffener ring 170 is adhered with the first dielectric layer 112a of the redistribution circuit structure 110 by the adhesive 180. The stiffener ring 170 may reduce and minimize warpage of the resulted structure illustrated in FIG. 7. In some embodiments, the stiffener ring 170 is copper ring, stainless ring or other metallic ring, and the adhesive 180 includes organic adhesive material. The first dielectric layer 112a having thickness greater than 7 micrometers may prevent chemical diffusion from the adhesive 180. The chemical diffusion from the adhesive 180 may be blocked by the first dielectric layer 112a having sufficient thickness. Furthermore, an interface between the first dielectric layer 112a and the first conductive wirings 114a may not be damage by the chemical diffusion from the adhesive 180. Accordingly, the delamination issue may not occur at the interface between the first dielectric layer 112a and the first conductive wirings 114a, and reliability of the redistribution circuit structure 110 may be improved.

Figure 9:
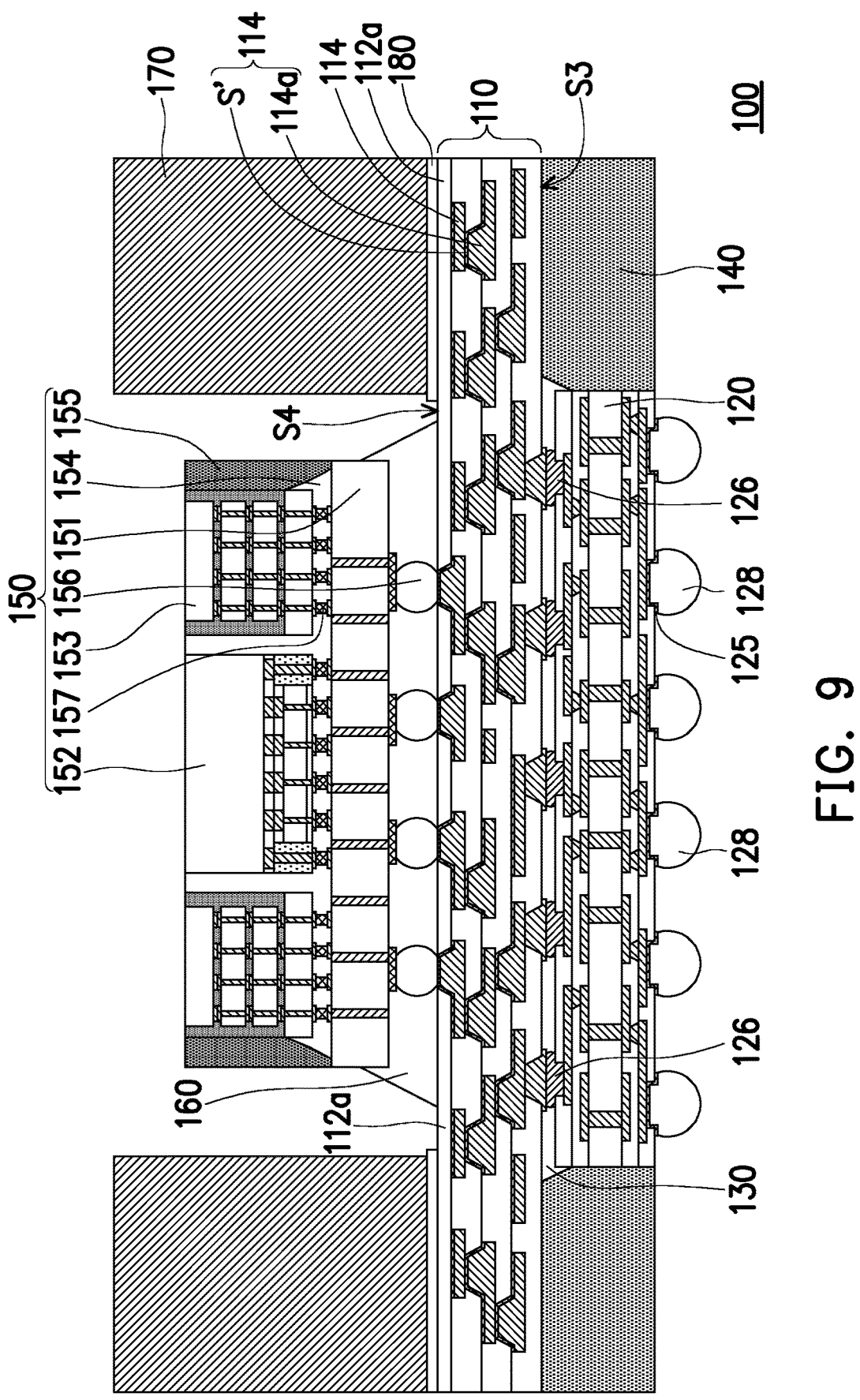

Referring to FIG. 8 and FIG. 9, a singulation process is performed to singulate the resulted structure illustrated in FIG. 8 such that a package structure 100 is obtained. The package structure 100 includes a redistribution circuit structure 110, a wiring substrate 120, an insulating encapsulation 140, a semiconductor device 150 and a stiffener ring 170 is provided. The redistribution circuit structure 110 includes a first surface S3 and a second surface S4 opposite to the first surface S3. The wiring substrate 120 is disposed on the first surface S3 of the redistribution circuit structure 110. The insulating encapsulation 140 is disposed on the first surface S3 of the redistribution circuit structure 110 and laterally encapsulating the wiring substrate 120. The semiconductor device 150 is disposed on the second surface S4 of the redistribution circuit structure 110, and the semiconductor device 150 is electrically connected to the wiring substrate 120 through the redistribution circuit structure 110. The stiffener ring 170 is adhered with the second surface S4 of the redistribution circuit structure 110 by an adhesive 180, wherein the stiffener ring 170 is adhered with an outermost dielectric layer 112a of the redistribution circuit structure 110 by the adhesive 180 and a thickness of the outermost dielectric layer 112a of the redistribution circuit structure 110 is greater than 7 micrometers.

In some embodiments, the package structure 100 may further include first conductive terminals 126 and a first underfill 130, wherein the first conductive terminals 126 are disposed between the redistribution circuit structure 110 and the wiring substrate 120, the redistribution circuit structure 110 is electrically connected to the wiring substrate 120 through the first conductive terminals 126, the first underfill 130 is disposed between the redistribution circuit structure 110 and the wiring substrate 120, and the first underfill 130 laterally encapsulates the first conductive terminals 126.

In some embodiments, the package structure 100 may further include second conductive terminals 156 and a second underfill 160, wherein the second conductive terminals 156 are disposed between the redistribution circuit structure 110 and the semiconductor device 150, the redistribution circuit structure 110 is electrically connected to the semiconductor device 150 through the second conductive terminals 156, the second underfill 160 is disposed between the redistribution circuit structure 110 and the semiconductor device 150, and the second underfill 160 laterally encapsulates the second conductive terminals 156.

Figures 10, 11:
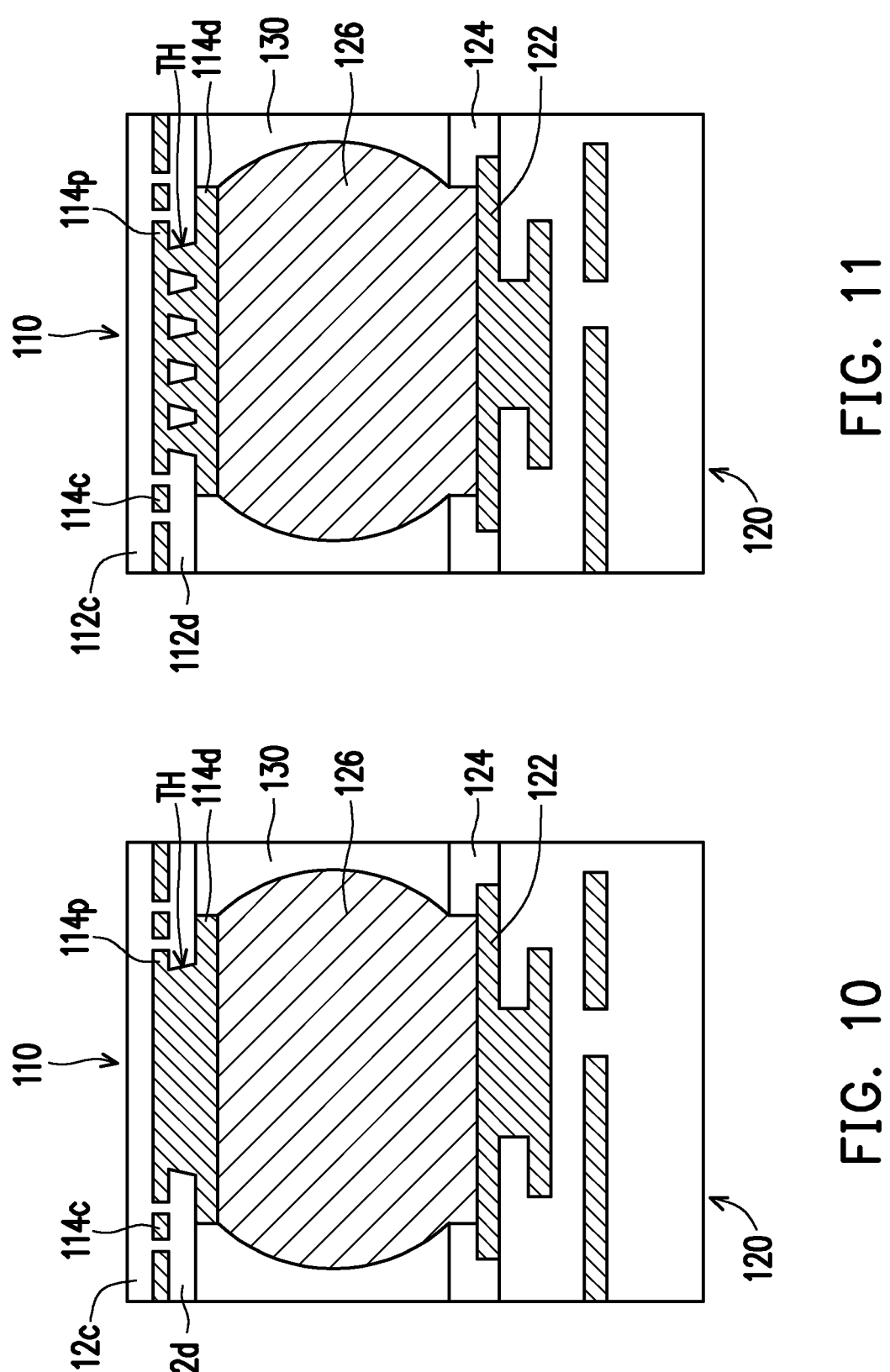
FIG. 10 is a cross-sectional view schematically illustrating a conductive terminal between the wiring substrate and the redistribution circuit structure in accordance with the first embodiment of the present application.
FIG. 11 is a cross-sectional view schematically illustrating a conductive terminal between the wiring substrate and the redistribution circuit structure in accordance with the second embodiment of the present application.

FIG. 10 is a cross-sectional view schematically illustrating a conductive terminal 126 disposed between the wiring substrate 120 and the redistribution circuit structure 110 in accordance with the first embodiment of the present application.

Referring to FIG. 10, a conductive terminal 126 disposed between the wiring substrate 120 and the redistribution circuit structure 110 is shown. In the embodiment illustrated in FIG. 10, the redistribution circuit structure 110 at least includes stacked dielectric layers 112c and 112d, redistribution wirings 114c embedded in the stacked dielectric layers 112c and 112d as well as a conductive pad 114d. The conductive pad 114d is disposed on a surface of an outermost dielectric layer 112d among the stacked dielectric layers 112c and 112d, the first conductive pad 114d is electrically connected to outermost redistribution pad 114p among the redistribution wirings 114c by a via opening TH1 defined in the outermost dielectric layer 112d, and the first lateral dimension of the via opening TH1 is greater than a half of the second lateral dimension of the outermost redistribution pad 114p. For example, the first lateral dimension of the via opening TH1 is about 190 micrometers, and the second lateral dimension of the outermost redistribution pad 114p is about 240 micrometers. In an embodiment where the first lateral dimension (e.g., about 190 micrometers) of the via opening TH1 is greater than a half of the second lateral dimension (e.g., about 240 micrometers) of the outermost redistribution pad 114p, the maximum stress concentrated on the dielectric layer 112d may be reduced about 12% (compared with a smaller via opening TH1 having a lateral dimension about 120 micrometers).

In some embodiments, the third lateral dimension of the conductive pad (e.g., the UBM pad) 114d is greater than the second dimension of the outermost redistribution pad 114p.

In the embodiment illustrated in FIG. 10, the conductive terminal 126 lands on and is electrically connected to the conductive pad 122 of the wiring substrate 120. The conductive terminal 126 protruding from the wiring substrate 120 is laterally encapsulated by an underfill 130 filled between the wiring substrate 120 and the redistribution circuit structure 110. The ring-shaped periphery region of the conductive pad 122 is covered by a solder resist layer 124, and the circular central region of the conductive pad 122 is covered by the conductive terminal 126. In this embodiment, the bottom portion of the conductive terminal 126 is in contact with the sidewalls of the solder resist layer 124. In other words, the position of the conductive terminal 126 is confined by an opening defined in the solder resist layer 124.

Furthermore, as illustrated in FIG. 10, the conductive pad 122 is spaced apart from the underfill 130 by the solder resist layer 124. In other words, the conductive pad 122 is not in contact with the underfill 130.

FIG. 11 is a cross-sectional view schematically illustrating a conductive terminal 126 between the wiring substrate 120 and the redistribution circuit structure 110 in accordance with the second embodiment of the present application.

Referring to FIG. 11, a conductive terminal 126 disposed between the wiring substrate 120 and the redistribution circuit structure 110 is shown. In the embodiment illustrated in FIG. 11, the redistribution circuit structure 110 at least includes stacked dielectric layers 112c and 112d, redistribution wirings 114c embedded in the stacked dielectric layers 112c and 112d as well as a conductive pad 114d. The conductive pad 114d is disposed on a surface of an outer-most dielectric layer 112d among the stacked dielectric layers 112c and 112d, the first conductive pad 114d is electrically connected to an outermost redistribution pad 114p among the redistribution wirings 114c by multiple via openings TH2 defined in the outermost dielectric layer 112d. In the present embodiment, the sum of the first lateral dimension of the multiple via openings TH2 is greater than a half of the second lateral dimension of the outermost redistribution pad 114p. For example, the first lateral dimension of the via openings TH2 is about 20 micrometers, and the second lateral dimension of the outermost redistribution pad 114p is about 240 micrometers. In the present embodiment, the via openings TH2 are arranged in array.

In some embodiments, the third lateral dimension of the conductive pad (e.g., the UBM pad) 114d is greater than the second dimension of the outermost redistribution pad 114p.

In the embodiment illustrated in FIG. 11, the conductive terminal 126 lands on and is electrically connected to the conductive pad 122 of the wiring substrate 120. The conductive terminal 126 protruding from the wiring substrate 120 is laterally encapsulated by an underfill 130 filled between the wiring substrate 120 and the redistribution circuit structure 110. The ring-shaped periphery region of the conductive pad 122 is covered by a solder resist layer 124, and the circular central region of the conductive pad 122 is covered by the conductive terminal 126. In this embodiment, the bottom portion of the conductive terminal 126 is in contact with the sidewalls of the solder resist layer 124. In other words, the position of the conductive terminal 126 is confined by an opening defined in the solder resist layer 124.

Figure 12:
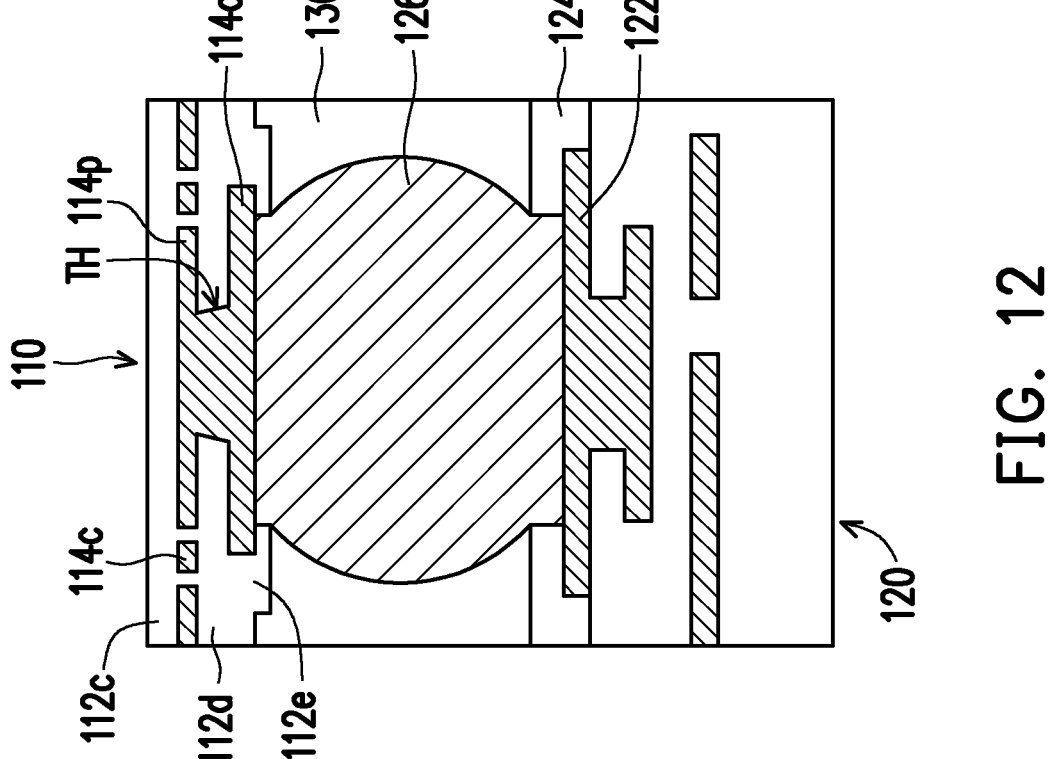
FIG. 12 is a cross-sectional view schematically illustrating a conductive terminal between the wiring substrate and the redistribution circuit structure in accordance with the third embodiment of the present application.

Furthermore, as illustrated in FIG. 12, the conductive pad 122 is spaced apart from the underfill 130 by the solder resist layer 124. In other words, the conductive pad 122 is not in contact with the underfill 130.

FIG. 12 is a cross-sectional view schematically illustrating a conductive terminal 126 between the wiring substrate 120 and the redistribution circuit structure 110 in accordance with the third embodiment of the present application.

Referring to FIG. 12, a conductive terminal 126 disposed between the wiring substrate 120 and the redistribution circuit structure 110 is shown. In the embodiment illustrated in FIG. 12, the redistribution circuit structure 110 at least includes stacked dielectric layers 112c, 112d and 112e, redistribution wirings 114c embedded in the stacked dielectric layers 112c, 112d and 112e as well as a conductive pad 114d. The conductive pad 114d is disposed on a surface of the dielectric layer 112d, and the conductive pad 114d is partially covered by the outermost dielectric layer 112e, the first conductive pad 114d is electrically connected to an outermost redistribution pad 114p among the redistribution wirings 114c by a via opening TH3 defined in the outermost dielectric layer 112d. For example, the ring-shaped periph-ery region of the conductive pad 114d is covered by the outermost dielectric layer 112e. In the present embodiment, the first lateral dimension of the via opening TH3 may be smaller, substantially equal to or greater than a half of the second lateral dimension of the outermost redistribution pad 114p. For example, the first lateral dimension of the via opening TH3 is about 120 micrometers, and the second lateral dimension of the outermost redistribution pad 114p is about 240 micrometers. In the present embodiment, the outermost dielectric layer 112e is in contact with the con-ductive terminal 126.

In some embodiments, the third lateral dimension of the conductive pad (e.g., the UBM pad) 114d is greater than the second dimension of the outermost redistribution pad 114p.

In the embodiment illustrated in FIG. 12, the conductive terminal 126 lands on and is electrically connected to the conductive pad 122 of the wiring substrate 120. The con-ductive terminal 126 protruding from the wiring substrate 120 is laterally encapsulated by an underfill 130 filled between the wiring substrate 120 and the redistribution circuit structure 110. The ring-shaped periphery region of the conductive pad 122 is covered by a solder resist layer 124, and the circular central region of the conductive pad 122 is covered by the conductive terminal 126. In this embodiment, the bottom portion of the conductive terminal 126 is in contact with the sidewalls of the solder resist layer 124. In other words, the position of the conductive terminal 126 is confined by an opening defined in the solder resist layer 124.

As illustrated in FIG. 12, the conductive pad 122 is spaced apart from the underfill 130 by the solder resist layer 124. In other words, the conductive pad 122 is not in contact with the underfill 130. Furthermore, the conductive pad 114d is spaced apart from the underfill 130 by the outermost dielec-tric layer 112e. In other words, the conductive pad 114d is not in contact with the underfill 130.

Figures 13, 14:
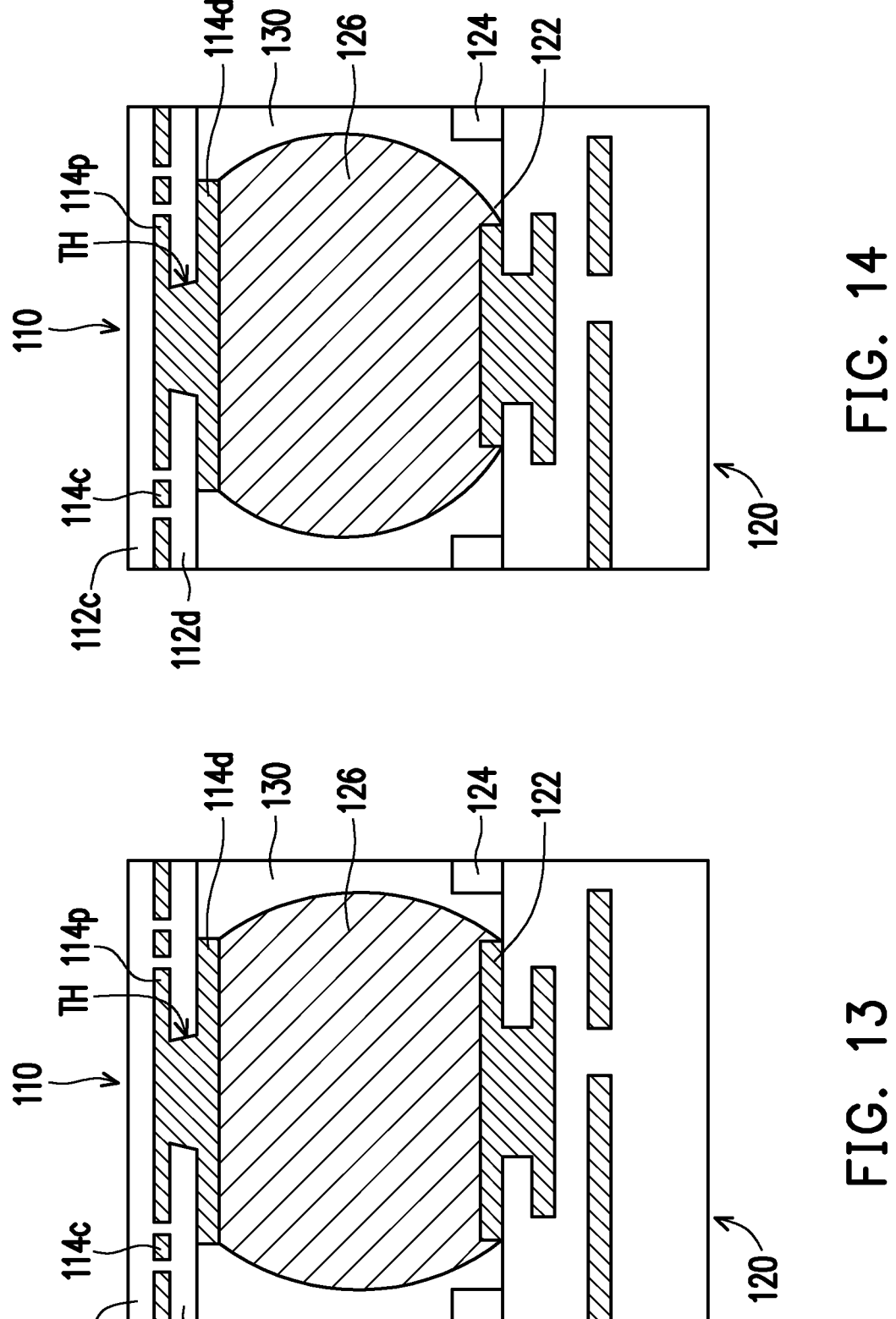
FIG. 13 is a cross-sectional view schematically illustrating a conductive terminal between the wiring substrate and the redistribution circuit structure in accordance with the fourth embodiment of the present application.
FIG. 14 is a cross-sectional view schematically illustrating a conductive terminal between the wiring substrate and the redistribution circuit structure in accordance with the fifth embodiment of the present application.

FIG. 13 is a cross-sectional view schematically illustrat-ing a conductive terminal 126 between the wiring substrate 120 and the redistribution circuit structure 110 in accordance with the fourth embodiment of the present application.

Referring to FIG. 13, a conductive terminal 126 disposed between the wiring substrate 120 and the redistribution circuit structure 110 is shown. In the embodiment illustrated in FIG. 13, the redistribution circuit structure 110 at least includes stacked dielectric layers 112c and 112d, redistribu-tion wirings 114c embedded in the stacked dielectric layers 112c and 112d as well as a conductive pad 114d. The conductive pad 114d is disposed on a surface of the dielec-tric layer 112d, the first conductive pad 114d is electrically connected to an outermost redistribution pad 114p among the redistribution wirings 114c by a via opening TH defined in the outermost dielectric layer 112d. In the present embodi-ment, the first lateral dimension of the via opening TH may be smaller, substantially equal to or greater than a half of the second lateral dimension of the outermost redistribution pad 114p. For example, the first lateral dimension of the via opening TH is about 120 micrometers, and the second lateral dimension of the outermost redistribution pad 114p is about 240 micrometers.

In some embodiments, the third lateral dimension of the conductive pad (e.g., the UBM pad) 114d is greater than the second dimension of the outermost redistribution pad 114p.

In the embodiment illustrated in FIG. 13, the conductive terminal 126 lands on and is electrically connected to the conductive pad 122 of the wiring substrate 120. The con-ductive terminal 126 protruding from the wiring substrate 120 is laterally encapsulated by an underfill 130 filled between the wiring substrate 120 and the redistribution circuit structure 110. The conductive terminal 126 is in contact with the top surface and the sidewalls of the con-ductive pad 122. The conductive terminal 126 is spaced apart from the solder resist layer 124, and a ring-shaped gap is formed between the conductive terminal 126 and the solder resist layer 124. In some embodiments, the ring-shaped gap is filled by the underfill 130. In some embodi-ments, the width of the ring-shaped gap ranges from about 20 micrometers to about 30 micrometers. The top surface of the conductive pad 122 may be entirely covered by the conductive terminal 126, and the conductive pad 122 is spaced apart from the solder resist layer 124. In this embodiment, the bottom portion of the conductive terminal 126 is not in contact with the sidewalls of the solder resist layer 124. In other words, the bottom portion of the conductive terminal 126 is spaced apart from the sidewalls of the solder resist layer 124 by a portion of the underfill 130 that is filled in the gap between the conductive terminal 126 and the solder resist layer 126.

In some embodiments, as illustrated in FIG. 13, the sidewalls of the conductive pad 122 are covered by the underfill 130 and the conductive terminal 126. In some other embodiments, not illustrated in figures, the sidewalls of the conductive pad 122 are entirely covered by the conductive terminal 126. Furthermore, the lateral dimension of the conductive pad 114*d* is substantially equal to the lateral dimension of the conductive pad 122.

FIG. 14 is a cross-sectional view schematically illustrating a conductive terminal 126 between the wiring substrate 120 and the redistribution circuit structure 110 in accordance with the fifth embodiment of the present application.

Referring to FIG. 13 and FIG. 14, the embodiment illustrated in FIG. 14 is similar with the embodiment illustrated in FIG. 13 except that the lateral dimension of the conductive pad 114*d* is greater than the lateral dimension of the conductive pad 122.

In some embodiments, the crack issue generated in the dielectric layer in the redistribution circuit structure in a SoIS structure can be solved by enlarging the contact area between the UBM patterns and the redistribution wirings. In some other embodiments, the crack issue of the solder resist layer of the wiring substrate in a SoIS structure can be solved by minimizing the contact area between the conductive terminals and the underlying contact pads. Since crack issue of the redistribution circuit structure and the wiring substrate in the SoIS structure, reliability and production yields of package structures having the SoIS structure can be enhanced.

In accordance with some embodiments of the disclosure, a package structure including a redistribution circuit structure, a wiring substrate, first conductive terminals, an insulating encapsulation, and a semiconductor device is provided. The redistribution circuit structure includes stacked dielectric layers, redistribution wirings embedded in the stacked dielectric layers and first conductive pads. The first conductive pads are disposed on a surface of an outermost dielectric layer among the stacked dielectric layers, the first conductive pads are electrically connected to outermost redistribution pads among the redistribution wirings by via openings of the outermost dielectric layer, and a first lateral dimension of the via openings is greater than a half of a second lateral dimension of the outermost redistribution pads. The wiring substrate includes second conductive pads. The first conductive terminals are disposed between the first conductive pads and the second conductive pads. The insulating encapsulation is disposed on the surface of the redistribution circuit structure. The insulating encapsulation laterally encapsulates the wiring substrate. The semiconductor device and the wiring substrate are disposed at opposite sides of the redistribution circuit structure. In some embodiments, the package structure further includes a stiffener ring, wherein the wiring substrate and the first conductive terminals are disposed at a first side of the redistribution circuit structure, and wherein the semiconductor device and the stiffener ring are disposed at a second side of the redistribution circuit structure. In some embodiments, the stiffener ring is adhered with the redistribution circuit structure by an adhesive. In some embodiments, the package structure further includes a first underfill disposed between the redistribution circuit structure and the wiring substrate, wherein the first underfill laterally encapsulates the first conductive terminals, and the insulating encapsulation laterally encapsulates the wiring substrate and the first underfill. In some embodiments, the package structure further includes second conductive terminals and a second underfill, wherein the second conductive terminals are disposed between the redistribution circuit structure and the semiconductor device, the redistribution circuit structure is electrically connected to the semiconductor device through the second conductive terminals, and the second underfill is disposed between the redistribution circuit structure and the semiconductor device and laterally encapsulates the second conductive terminals. In some embodiments, the first lateral dimension of the via openings is about 190 micrometers, and the second lateral dimension of the outermost redistribution pads is about 240 micrometers. In some embodiments, a third lateral dimension of the first conductive pads is greater than the second dimension of the outermost redistribution pads.

In accordance with some other embodiments of the disclosure, a package structure including a redistribution circuit structure, a wiring substrate, first conductive terminals, an insulating encapsulation, and a semiconductor device is provided. The redistribution circuit structure includes stacked dielectric layers, redistribution wirings embedded in the stacked dielectric layers and first conductive pads. The first conductive pads are disposed on a surface of an outermost dielectric layer among the stacked dielectric layers, and a first conductive pad among the first conductive pads is electrically connected to an outermost redistribution pad among the redistribution wirings by via openings of the outermost dielectric layer. The wiring substrate includes second conductive pads. The first conductive terminals are disposed between the first conductive pads and the second conductive pads. The insulating encapsulation is disposed on the surface of the redistribution circuit structure. The insulating encapsulation laterally encapsulates the wiring substrate. The semiconductor device and the wiring substrate are disposed at opposite sides of the redistribution circuit structure. In some embodiments, the package structure further includes a stiffener ring, wherein the wiring substrate and the first conductive terminals are disposed at a first side of the redistribution circuit structure, and wherein the semiconductor device and the stiffener ring are disposed at a second side of the redistribution circuit structure. In some embodiments, the stiffener ring is adhered with the redistribution circuit structure by an adhesive. In some embodiments, the package structure further includes a first underfill disposed between the redistribution circuit structure and the wiring substrate, wherein the first underfill laterally encapsulates the first conductive terminals, and the insulating encapsulation laterally encapsulates the wiring substrate and the first underfill. In some embodiments, the package structure further includes second conductive terminals and a second underfill, wherein the second conductive terminals are disposed between the redistribution circuit structure and the semiconductor device, the redistribution circuit structure is electrically connected to the semiconductor device through the second conductive terminals, and the second underfill is disposed between the redistribution circuit structure and the semiconductor device as well as laterally encapsulates the second conductive terminals. In some embodiments, the via openings between the first conductive pad among the first conductive pads and the outermost redistribution pad among the redistribution wirings are arranged in array. In some embodiments, a lateral dimension of the first conductive pads is greater than a dimension of the outermost redistribution pads.

In accordance with some alternative embodiments of the disclosure, a package structure including a redistribution circuit structure, a wiring substrate, first conductive terminals, an insulating encapsulation, and a semiconductor device is provided. The redistribution circuit structure includes first conductive pads. The wiring substrate includes second conductive pads and solder resist layer, wherein each of the second conductive pads is spaced apart from the solder resist layer. The first conductive terminals are disposed between the first conductive pads and the second conductive pads. The insulating encapsulation is disposed on the surface of the redistribution circuit structure, and the insulating encapsulation laterally encapsulates the wiring substrate. The semiconductor device, wherein the semiconductor device and the wiring substrate are disposed at opposite sides of the redistribution circuit structure. In some embodiments, each of the second conductive pads is spaced apart from the solder resist layer by a ring-shaped gap. In some embodiments, a width of the ring-shaped gap ranges from about 20 micrometers to about 30 micrometers. In some embodiments, the package structure further includes a first underfill disposed between the redistribution circuit structure and the wiring substrate, wherein the first underfill laterally encapsulates the first conductive terminals, and the insulating encapsulation laterally encapsulates the wiring substrate and the first underfill. In some embodiments, each of the second conductive pads is spaced apart from the solder resist layer by a ring-shaped gap, and the ring-shaped gap is filled by the first underfill. In some embodiments, the package structure further includes second conductive terminals and a second underfill, wherein the second conductive terminals are disposed between the redistribution circuit structure and the semiconductor device, the redistribution circuit structure is electrically connected to the semiconductor device through the second conductive terminals, and the second underfill disposed between the redistribution circuit structure and the semiconductor device as well as laterally encapsulates the second conductive terminals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:

a redistribution circuit structure comprising stacked dielectric layers, redistribution wirings embedded in the stacked dielectric layers and first conductive pads, wherein the first conductive pads are disposed on a surface of an outermost dielectric layer among the stacked dielectric layers, the first conductive pads are electrically connected to outermost redistribution pads among the redistribution wirings by via openings of the outermost dielectric layer, and a first lateral dimension of the via openings is greater than a half of a second lateral dimension of the outermost redistribution pads;

a wiring substrate comprising second conductive pads;

first conductive terminals disposed between the first conductive pads and the second conductive pads;

an insulating encapsulation disposed on the surface of the redistribution circuit structure, the insulating encapsulation laterally encapsulating the wiring substrate;

a semiconductor device, wherein the semiconductor device and the wiring substrate are disposed at opposite sides of the redistribution circuit structure; and a first underfill disposed between the redistribution circuit structure and the wiring substrate, wherein the first underfill laterally encapsulates the first conductive pads and the first conductive terminals, the insulating encapsulation is in contact with the outermost dielectric layer, and the insulating encapsulation laterally encapsulates the wiring substrate and the first underfill.

2. The package structure as claimed in claim 1 further comprising:

a stiffener ring, wherein the wiring substrate and the first conductive terminals are disposed at a first side of the redistribution circuit structure, and wherein the semiconductor device and the stiffener ring are disposed at a second side of the redistribution circuit structure.

3. The package structure as claimed in claim 2, wherein the stiffener ring is adhered with the redistribution circuit structure by an adhesive.

4. The package structure as claimed in claim 1, wherein the first conductive pads protrude from the surface of the outermost dielectric layer.

5. The package structure as claimed in claim 1 further comprising:

second conductive terminals disposed between the redistribution circuit structure and the semiconductor device, wherein the redistribution circuit structure is electrically connected to the semiconductor device through the second conductive terminals; and a second underfill disposed between the redistribution circuit structure and the semiconductor device and laterally encapsulating the second conductive terminals.

6. The package structure as claimed in claim 1, wherein the first lateral dimension of the via openings is about 190 micrometers, and the second lateral dimension of the outermost redistribution pads is about 240 micrometers.

7. The package structure as claimed in claim 1, wherein a third lateral dimension of the first conductive pads is greater than the second dimension of the outermost redistribution pads.

8. A package structure, comprising:

a redistribution circuit structure comprising stacked dielectric layers, redistribution wirings embedded in the stacked dielectric layers and first conductive pads, wherein the first conductive pads are disposed on a surface of an outermost dielectric layer among the stacked dielectric layers, and a first conductive pad among the first conductive pads is electrically connected to an outermost redistribution pad among the redistribution wirings by via openings of the outermost dielectric layer;

a wiring substrate comprising second conductive pads;

first conductive terminals disposed between the first conductive pads and the second conductive pads;

an insulating encapsulation disposed on the surface of the redistribution circuit structure, the insulating encapsulation laterally encapsulating the wiring substrate; and a semiconductor device, wherein the semiconductor device and the wiring substrate are disposed at opposite sides of the redistribution circuit structure; and a first underfill disposed between the redistribution circuit structure and the wiring substrate, wherein the first underfill is in contact with the first conductive pads, and the first underfill laterally encapsulates the first conductive terminals.

9. The package structure as claimed in claim 8 further comprising:

a stiffener ring, wherein the wiring substrate and the first conductive terminals are disposed at a first side of the redistribution circuit structure, and wherein the semiconductor device and the stiffener ring are disposed at a second side of the redistribution circuit structure.

10. The package structure as claimed in claim 9, wherein the stiffener ring is adhered with the redistribution circuit structure by an adhesive.

11. The package structure as claimed in claim 8, wherein the insulating encapsulation laterally encapsulates the wiring substrate and the first underfill.

12. The package structure as claimed in claim 8 further comprising:

second conductive terminals disposed between the redistribution circuit structure and the semiconductor device, wherein the redistribution circuit structure is electrically connected to the semiconductor device through the second conductive terminals; and a second underfill disposed between the redistribution circuit structure and the semiconductor device and laterally encapsulating the second conductive terminals.

13. The package structure as claimed in claim 8, wherein the insulating encapsulation is in contact with the surface of the outermost dielectric layer.

14. The package structure as claimed in claim 8, wherein a lateral dimension of the first conductive pads is greater than a dimension of the outermost redistribution pads.

15. A package structure, comprising:

a redistribution circuit structure comprising first conductive pads;

a wiring substrate comprising second conductive pads and solder resist layer, wherein each of the second conductive pads is spaced apart from the solder resist layer;

first conductive terminals disposed between the first conductive pads and the second conductive pads;

an insulating encapsulation disposed on the surface of the redistribution circuit structure, the insulating encapsulation laterally encapsulating the wiring substrate;

a semiconductor device, wherein the semiconductor device and the wiring substrate are disposed at opposite sides of the redistribution circuit structure; and a first underfill disposed between the redistribution circuit structure and the wiring substrate, wherein the first underfill is in contact with the first conductive pads, and the first underfill laterally encapsulates the first conductive terminals.

16. The package structure as claimed in claim 15, wherein each of the second conductive pads is spaced apart from the solder resist layer by a ring-shaped gap.

17. The package structure as claimed in claim 16, wherein a width of the ring-shaped gap ranges from about 20 micrometers to about 30 micrometers.

18. The package structure as claimed in claim 15, wherein the second conductive pads are spaced apart from the solder resist layer by a ring-shaped gap.

19. The package structure as claimed in claim 18, wherein the ring-shaped gap is filled by the first underfill.

20. The package structure as claimed in claim 18 further comprising:

second conductive terminals disposed between the redistribution circuit structure and the semiconductor device, wherein the redistribution circuit structure is electrically connected to the semiconductor device through the second conductive terminals; and a second underfill disposed between the redistribution circuit structure and the semiconductor device and laterally encapsulating the second conductive terminals.

* * * * *